(12) United States Patent
Yuan et al.

(10) Patent No.: US 11,605,689 B2
(45) Date of Patent: Mar. 14, 2023

(54) ARRAY SUBSTRATE AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Changlong Yuan, Beijing (CN); Benlian Wang, Beijing (CN); Yingsong Xu, Beijing (CN); Xilei Cao, Beijing (CN)

(73) Assignees: Chengdu BOE Optoelectronics Technology Co., Ltd., Sichuan (CN); BOETECHNOLOGY GROUP CO., LTD., Beijing (CN)

( * ) Notice: Subject to any disclaimer, the term of this patent is extended or adjusted under 35 U.S.C. 154(b) by 376 days.

(21) Appl. No.: 16/975,241

(22) PCT Filed: Oct. 30, 2019

(86) PCT No.: PCT/CN2019/114384
§ 371 (c)(1),
(2) Date: Aug. 24, 2020

(87) PCT Pub. No.: WO2021/081814
PCT Pub. Date: May 6, 2021

(65) Prior Publication Data
US 2022/0376019 A1    Nov. 24, 2022

(51) Int. Cl.
*G09G 3/3233* (2016.01)
*H01L 27/32* (2006.01)

(52) U.S. Cl.
CPC ....... *H01L 27/3265* (2013.01); *G09G 3/3233* (2013.01); *G09G 2300/0426* (2013.01); *G09G 2300/08* (2013.01); *G09G 2300/0842* (2013.01)

(58) Field of Classification Search
CPC ......... G09G 3/3233; G09G 2300/0426; G09G 2300/0842; H01L 27/3265
See application file for complete search history.

(56) References Cited

U.S. PATENT DOCUMENTS

| 6,914,767 B2 * | 7/2005 | Togashi | H01G 4/40 361/306.3 |
| 7,099,138 B1 | 8/2006 | Togashi et al. | |

(Continued)

FOREIGN PATENT DOCUMENTS

| CN | 1812026 A | 8/2006 |
| CN | 101523527 A | 9/2009 |

(Continued)

OTHER PUBLICATIONS

International Search Report of PCT/CN2019/114384, dated Aug. 11, 2020.

(Continued)

*Primary Examiner* — Kevin M Nguyen
(74) *Attorney, Agent, or Firm* — Collard & Roe, P.C.

(57) ABSTRACT

An array substrate and a display device. The array substrate includes a base substrate, a first electrode, a first insulating layer and a second electrode. The first electrode is on the base substrate; the first insulating layer is on a side of the first electrode away from the base substrate; the second electrode is on a side of the first insulating layer away from the first electrode. The second electrode is provided with a first through-hole and a slit communicated with the first through-hole and extending from the first through-hole to an edge of the second electrode, and an orthographic projection of the first electrode on the base substrate completely falls within an orthographic projection of the second electrode, the first through-hole and the slit on the base substrate. At (Continued)

this time, the first electrode, the second electrode, and the first insulating layer can constitute a capacitor.

15 Claims, 5 Drawing Sheets

(56) References Cited

U.S. PATENT DOCUMENTS

| | | | |
|---|---|---|---|
| 7,671,704 B2* | 3/2010 | Hsu ...................... | H03H 5/00 333/185 |
| 8,009,406 B2 | 8/2011 | Gevorgyan et al. | |
| 9,245,908 B2 | 1/2016 | Lee et al. | |
| 2014/0061606 A1 | 3/2014 | Kim et al. | |
| 2018/0184212 A1* | 6/2018 | Kasai ................... | H04R 19/005 |
| 2019/0080999 A1 | 3/2019 | Eom et al. | |
| 2019/0237494 A1 | 8/2019 | Bae et al. | |
| 2020/0411611 A1 | 12/2020 | Liu et al. | |
| 2021/0320130 A1 | 10/2021 | Xian et al. | |
| 2021/0320166 A1 | 10/2021 | Zhao et al. | |

FOREIGN PATENT DOCUMENTS

| | | |
|---|---|---|
| CN | 202142043 U | 2/2012 |
| CN | 104377166 A | 2/2015 |
| CN | 109494213 A | 3/2019 |
| CN | 110034132 A | 7/2019 |
| CN | 110098196 A | 8/2019 |
| CN | 110211975 A | 9/2019 |
| CN | 110265458 A | 9/2019 |
| CN | 110335564 A | 10/2019 |
| JP | S59-119818 A | 7/1984 |
| KR | 101972574 B1 | 4/2019 |
| KR | 20190119561 A1 | 10/2019 |

OTHER PUBLICATIONS

Written Opinion of the International Searching Authority of PCT/CN2019/114384, dated Aug. 11, 2020.
Chinese Office Action in Chinese Application No. 201980002201.6 dated May 7, 2022 with English translation.
International Search Report of PCT/CN2019/114384 in Chinese, dated Aug. 11, 2020.
Notice of Transmittal of the International Search Report of PCT/CN2019/114384 in Chinese, dated Aug. 11, 2020.
Written Opinion of the International Searching Authority of PCT/CN2019/114384 in Chinese, dated Aug. 11, 2020.
Extended European Search Report in European Patent Application No. 19948863.6 dated Oct. 17, 2022.

* cited by examiner

ARRAY SUBSTRATE AND DISPLAY DEVICE

CROSS REFERENCE TO RELATED APPLICATIONS

This application is the National Stage of PCT/CN2019/114384 filed on Oct. 30, 2019, the disclosure of which is incorporated by reference.

TECHNICAL FIELD

Embodiments of the present disclosure relate to an array substrate and a display device.

BACKGROUND

With the continuous development of display technology, organic light emitting diode (OLED) display panel has been increasingly used in various electronic devices because of its advantages of self-illumination, wide viewing angle, high contrast, low power consumption and high reaction speed.

The OLED display panel includes an array substrate, and the array substrate includes a plurality of pixel driving circuits and a plurality of organic light emitting structures, and the plurality of pixel driving circuits are used for respectively driving the plurality of organic light emitting structures to emit light. Generally, each pixel driving circuit can include a plurality of thin film transistors (TFT) and at least one capacitor. The capacitor includes an upper electrode, a lower electrode, and a dielectric between the upper electrode and the lower electrode.

SUMMARY

Embodiments of the present disclosure provide an array substrate and a display device. In the array substrate, the second electrode is provided with a first through-hole and a slit, and the orthographic projection of the second electrode, the first through-hole and the slit on the base substrate completely covers the orthographic projection of the first electrode on the base substrate. Therefore, when misalignment occurs between the base substrate and the mask plate or exposure device, which leads to overlapping deviation between the formed first electrode and second electrode, the overlapping area between the first electrode and the second electrode remains unchanged, thus ensuring that the actual capacitance value of the capacitor is consistent with the design value, and further improving the yield of the display device using the array substrate. In addition, the capacitance value of the capacitor can be flexibly adjusted by adjusting the size of the slit without changing the shape and size of the first electrode and the second electrode.

At least one embodiment of the present disclosure provides an array substrate, including: a base substrate; a first electrode, on the base substrate; a first insulating layer, on a side of the first electrode away from the base substrate; and a second electrode, on a side of the first insulating layer away from the first electrode. The array substrate further includes a first through-hole in the second electrode and a slit communicated with the first through-hole and extending from the first through-hole to an edge of the second electrode, an orthographic projection of the second electrode, the first through-hole and the slit on the base substrate completely covers an orthographic projection of the first electrode on the base substrate.

For example, the array substrate provided by one embodiment of the present disclosure further includes: a second insulating layer, on a side of the second electrode away from the base substrate; and a connection electrode. The first insulating layer is provided with a second through-hole exposing the first electrode, the second insulating layer is partially located in the first through-hole and forms a third through-hole separated from the second electrode in the first through-hole, an orthographic projection of the third through-hole on the base substrate at least partially overlaps with an orthographic projection of the second through-hole on the base substrate, and the connection electrode is located in the second through-hole and in the third through-hole and connected to the first electrode.

For example, in the array substrate provided by one embodiment of the present disclosure, the slit has an extending direction, and a length of the slit in the extending direction is in a range from 1 µm to 30 µm.

For example, in the array substrate provided by one embodiment of the present disclosure, the slit has an extending direction, and a width of the slit in a direction perpendicular to the extending direction is in a range from 0.01 µm to 20 µm.

For example, the array substrate provided by one embodiment of the present disclosure further includes: an active layer, on the base substrate; a gate insulating layer, on a side of the active layer away from the base substrate; a first conductive layer, on a side of the gate insulating layer away from the active layer; and a second conductive layer. The first conductive layer includes the first electrode, the first insulating layer is on a side of the first conductive layer away from the gate insulating layer, the second conductive layer is on a side of the first insulating layer away from the first conductive layer, and the second conductive layer includes the second electrode.

For example, the array substrate provided by one embodiment of the present disclosure further includes: a third conductive layer, on a side of the second insulating layer away from the second electrode; a gate line, in the first conductive layer and extending in a first direction; and a data line, in the third conductive layer and extending in a second direction, an extending direction of the slit is substantially parallel to the second direction.

For example, the array substrate provided by one embodiment of the present disclosure further includes: a planarization layer, on a side of the third conductive layer away from the second insulating layer; an anode, on a side of the planarization layer away from the third conductive layer; an organic light emitting layer, on a side of the anode away from the planarization layer; and a cathode, on a side of the organic light emitting layer away from the anode.

For example, the array substrate provided by one embodiment of the present disclosure further includes: a first thin film transistor, including a first gate electrode, a first source electrode and a first drain electrode; a second thin film transistor, including a second gate electrode, a second source electrode and a second drain electrode; a third thin film transistor, including a third gate electrode, a third source electrode and a third drain electrode; a fourth thin film transistor, including a fourth gate electrode, a fourth source electrode and a fourth drain electrode; a fifth thin film transistor, including a fifth gate electrode, a fifth source electrode and a fifth drain electrode; a sixth thin film transistor, including a sixth gate electrode, a sixth source electrode and a sixth drain electrode; and a seventh thin film transistor, including a seventh gate electrode, a seventh source electrode and a seventh drain electrode. The first gate electrode of the first thin film transistor is connected to the third drain electrode of the third thin film transistor and the fourth drain electrode of the fourth thin film transistor, the first source electrode of the first thin film transistor is connected to the second drain electrode of the second thin film transistor and the fifth drain electrode of the fifth thin film transistor, and the first drain electrode of the first thin film transistor is connected to the third source electrode of the third thin film transistor and the sixth source electrode of the sixth thin film transistor, the first electrode is connected to the first gate electrode of the first thin film transistor and the third drain electrode of the third thin film transistor, and the second electrode is configured to be connected to a power supply line.

For example, in the array substrate provided by one embodiment of the present disclosure, an orthographic projection of the first through-hole on the base substrate at least partially overlaps with an orthographic projection of the first gate electrode of the first thin film transistor on the base substrate.

For example, in the array substrate provided by one embodiment of the present disclosure, the first electrode includes a rectangle shape.

At least one embodiment of the present disclosure further provides a display device, including the array substrate according to any one of the above.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

The OLED display panel includes an array substrate, and the array substrate includes a plurality of pixel driving circuits and a plurality of organic light emitting structures, and the plurality of pixel driving circuits are used for respectively driving the plurality of organic light emitting structures to emit light. Generally, each pixel driving circuit can include a plurality of thin film transistors (TFT) and at least one capacitor. The capacitor includes an upper electrode, a lower electrode, and a dielectric between the upper electrode and the lower electrode.

Generally, patterning processes such as photolithography and etching are used to form the above pixel driving circuits on the base substrate. In this case, the formation process of the capacitor can include: forming a first conductive layer on a base substrate, and then patterning the first conductive layer by a patterning process to form a lower electrode; forming an insulating layer on the base substrate on which the lower electrode is formed; and forming a second conductive layer on the base substrate on which the insulating layer is formed, and then patterning the second conductive layer by a patterning process to form an upper electrode. However, in the process of patterning the two conductive layers, misalignment may occur between the base substrate and the mask plate or exposure device, thus resulting in overlapping deviation between the formed upper electrode and the formed lower electrode. Therefore, the overlapping deviation between the upper electrode and the lower electrode easily leads to the deviation between the actual capacitance value and the design capacitance value of the capacitor, which leads to abnormal display. On the other hand, because the layout design of the pixel driving circuit is complex, when the capacitance value of the capacitor needs to be adjusted, it is likely that the whole pixel driving circuit needs to be redesigned, resulting in an increase in cost.

In order to solve the above technical problems, embodiments of the present disclosure provide an array substrate and a display device. The array substrate includes a base substrate, a first electrode, a first insulating layer, and a second electrode. The first electrode is located on the base substrate; the first insulating layer is located on a side of the first electrode away from the base substrate; the second electrode is located on a side of the first insulating layer away from the first electrode. The second electrode is provided with a first through-hole, and a slit communicated with the first through-hole and extending from the first through-hole to an edge of the second electrode, and an orthographic projection of the first electrode on the base substrate completely falls within an orthographic projection of the second electrode, the first through-hole, and the slit on the base substrate. In this case, the first electrode, the second electrode, and the first insulating layer between the first electrode and the second electrode can constitute a capacitor. Because the orthographic projection of the second electrode, the first through-hole, and the slit on the base substrate completely covers the orthographic projection of the first electrode on the base substrate, when the misalignment occurs between the base substrate and the mask plate or the exposure device, the overlapping area between the first electrode and the second electrode will not change, thus ensuring that the actual capacitance value of the capacitor is consistent with the design value, and further improving the yield of the display device using the array substrate. In addition, the capacitance value of the capacitor can be flexibly adjusted by adjusting the size of the slit without changing the shape and size of the first electrode and the second electrode.

Hereinafter, the array substrate and the display device provided by the embodiments of the present disclosure will be described in detail with reference to the drawings.

Figure 1:
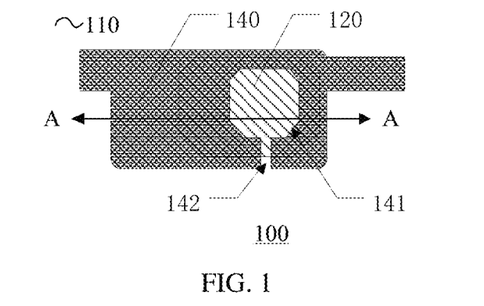
FIG. 1 is a schematic plan view of a capacitor on an array substrate according to an embodiment of the present disclosure.
Figure 2:
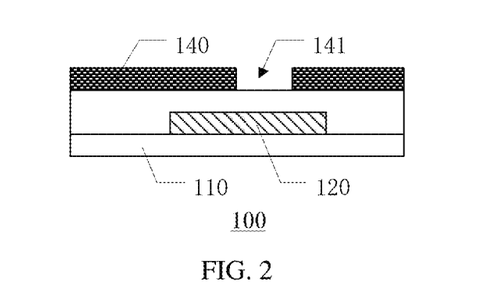
FIG. 2 is a schematic sectional view of a capacitor on an array substrate in the A-A direction in FIG. 1 according to an embodiment of the present disclosure.

FIG. 1 is a schematic plan view of a capacitor on an array substrate according to an embodiment of the present disclosure. FIG. 2 is a schematic sectional view of a capacitor on an array substrate in the A-A direction in FIG. 1 according to an embodiment of the present disclosure. As illustrated by FIGS. 1 and 2, the array substrate 100 includes a base substrate 110, a first electrode 120, a first insulating layer 130, and a second electrode 140. The first electrode 120 is located on the base substrate 110; the first insulating layer 130 is located on a side of the first electrode 120 away from the base substrate 110. The second electrode 140 is located on a side of the first insulating layer 130 away from the first electrode 120. A first through-hole 141 and a slit 142 communicating with the first through-hole 141 and extending from the first through-hole 141 to the edge of the second electrode 140 are arranged in the second electrode 140. An orthographic projection of the first electrode 120 on the base substrate 110 completely falls within an orthographic projection of the second electrode 140, the first through-hole 141, and the slit 142 on the base substrate 110. In this case, the first electrode 120, the second electrode 140, and the first insulating layer 130 between the first electrode 120 and the second electrode 140 can constitute a capacitor Cst.

In the array substrate provided by the embodiments of the present disclosure, because the orthographic projection of the first electrode on the base substrate completely falls within the orthographic projection of the second electrode, the first through-hole and the slit on the base substrate, upon the misalignment between the base substrate and the mask plate or exposure device causing the overlapping deviation between the first electrode and the second electrode, the overlapping area between the first electrode and the second electrode changes little or even remains unchanged, thus ensuring that the actual capacitance value of the capacitor is consistent with the design value, and further improving the yield of the display device using the array substrate. In addition, the capacitance value of the capacitor can be flexibly adjusted by adjusting the size of the slit without changing the shape and size of the first electrode and the second electrode.

In some examples, as illustrated by FIG. 1, the slit 142 has an extending direction, and a length of the slit 142 in the extending direction is in a range from 0 μm to 30 μm. In this case, the capacitor Cst constituted by the first electrode 120, the second electrode 140, and the first insulating layer 130 has better performance.

In some examples, as illustrated by FIG. 1, the slit 142 has an extending direction, and a width of the slit 142 in a direction perpendicular to the extending direction is in a range from 0.01 μm to 20 μm. In this case, the capacitor Cst constituted by the first electrode 120, the second electrode 140, and the first insulating layer 130 has better performance.

In some examples, as illustrated by FIG. 1, the first electrode 120 has a rectangle shape. It should be noted that, in the actual process, the first electrode 120 as formed has chamfers, that is, the shape of the first electrode 120 is a rectangle with chamfers at the four corners.

Figure 3:
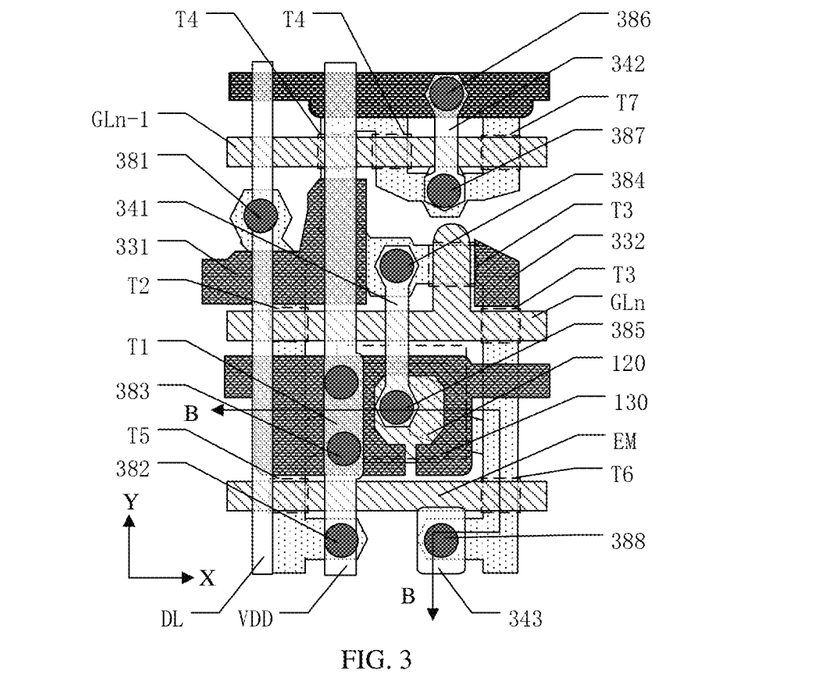
FIG. 3 is a schematic plan view of an array substrate according to an embodiment of the present disclosure.
Figure 4:
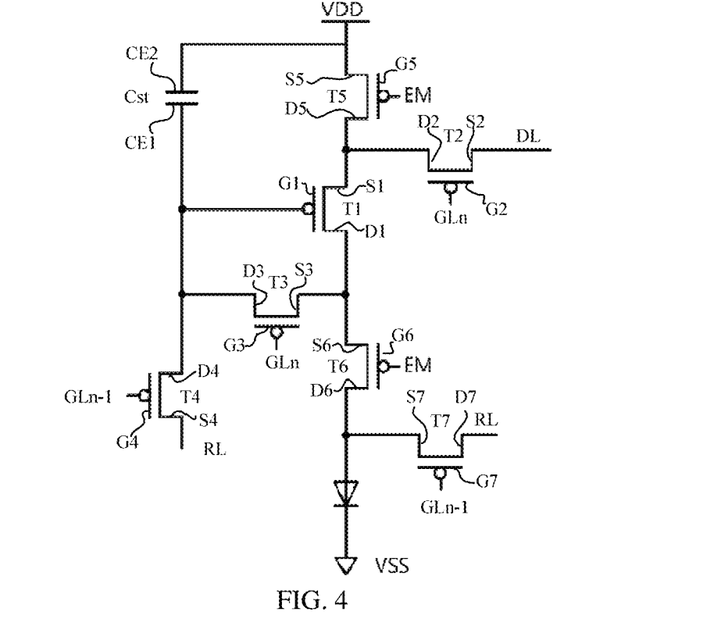
FIG. 4 is an equivalent schematic diagram of a pixel driving circuit on the array substrate illustrated in FIG. 3.

FIG. 3 is a schematic plan view of an array substrate according to an embodiment of the present disclosure; FIG. 4 is an equivalent schematic diagram of the pixel driving circuit on the array substrate illustrated in FIG. 3. As illustrated by FIGS. 3 and 4, the array substrate further includes a first thin film transistor T1, a second thin film transistor T2, a third thin film transistor T3, a fourth thin film transistor T4, a fifth thin film transistor T5, a sixth thin film transistor T6, and a seventh thin film transistor T7. The first thin film transistor T1 includes a first gate electrode G1, a first source electrode S1, and a first drain electrode D1. The second thin film transistor T2 includes a second gate electrode G2, a second source electrode S2, and a second drain electrode D2. The third thin film transistor T3 includes a third gate electrode G3, a third source electrode S3, and a third drain electrode D3. The fourth thin film transistor T4 includes a fourth gate electrode G4, a fourth source electrode S4, and a fourth drain electrode D4. The fifth thin film transistor T5 includes a fifth gate electrode G5, a fifth source electrode S5, and a fifth drain electrode D5. The sixth thin film transistor T6 includes a sixth gate electrode G6, a sixth source electrode S6, and a sixth drain electrode D6. The seventh thin film transistor T7 includes a seventh gate electrode G7, a seventh source electrode S7, and a seventh drain electrode D7. The first gate electrode G1 of the first thin film transistor T1 is connected to the third drain electrode D3 of the third thin film transistor T3 and the fourth drain electrode D4 of the fourth thin film transistor T4. The first source electrode S1 of the first thin film transistor T1 is connected to the second drain electrode D2 of the second thin film transistor T2 and the fifth drain electrode D5 of the fifth thin film transistor T5, the first drain electrode D1 of the first thin film transistor T1 is connected to the third source electrode S3 of the third thin film transistor T3 and the sixth source electrode S6 of the sixth thin film transistor T6, the first electrode 120 is connected to the first gate electrode G1 of the first thin film transistor T1 and the third drain electrode D3 of the third thin film transistor T3, and the second electrode 140 is configured to be connected to a power supply line. Therefore, the thin film transistors T1, T2, T3, T4, T5, T6 and T7 and the capacitor Cst can constitute a pixel driving circuit.

In some examples, as illustrated by FIGS. 3 and 4, the array substrate further includes gate lines GL, a emission control line EM, an initialization line RL, a data line DL, and a power supply line VDD. The gate lines GL are used for transmitting gate signals and can include a first gate line GLn and a second gate line GLn-1. The emission control line EM can transmit a control signal. The initialization line RL can transmit an initialization signal. The data line DL can transmit a data signal. The power supply line VDD can transmit a power signal.

In some examples, as illustrated by FIG. 4, the second gate electrode G2 of the second thin film transistor T2 is connected to the first gate line GLn, the second source electrode S2 of the second thin film transistor T2 is connected to the data line DL, and the second drain electrode D2 of the second thin film transistor T2 is connected to the first source electrode S1 of the thin film transistor T1.

In some examples, as illustrated by FIG. 4, the third gate electrode G3 of the third thin film transistor T3 is connected to the first gate line GLn, the third source electrode S3 of the third thin film transistor T3 is connected to the first drain electrode D1 of the first thin film transistor T1, and the third drain electrode D3 of the third thin film transistor T3 is connected to the first gate electrode G1 of the first thin film transistor T1.

For example, as illustrated by FIG. 4, the fourth gate electrode G4 of the fourth thin film transistor T4 is connected to the second gate line GLn-1, the fourth source electrode S4 of the fourth thin film transistor T4 is connected to the initialization line RL, and the fourth drain electrode D4 of the fourth thin film transistor T4 is connected to the first gate electrode G1 of the first thin film transistor T1, and an initialization voltage Vint is applied through the initialization line RL.

For example, as illustrated by FIG. 4, the fifth gate electrode G5 of the fifth thin film transistor T5 is connected to the emission control line EM, the fifth source electrode S5 of the fifth thin film transistor T5 is connected to the power supply line VDD, and the fifth drain electrode D5 of the fifth thin film transistor T5 is connected to the first source electrode S1 of the first thin film transistor T1.

For example, as illustrated by FIG. 4, the sixth gate electrode G6 of the sixth thin film transistor T6 is connected to the emission control line EM, the sixth source electrode S6 of the sixth thin film transistor T6 is connected to the first drain electrode D1 of the first thin film transistor T1, and the sixth drain electrode D6 of the sixth thin film transistor T6 is connected to the anode of the corresponding light emitting structure.

For example, as illustrated by FIG. 4, the seventh gate electrode G7 of the seventh thin film transistor T7 is connected to the second gate line GLn-1, the seventh source electrode S7 of the seventh thin film transistor T7 is connected to the anode of each sub-pixel, and the seventh drain electrode D7 of the seventh thin film transistor T7 is connected to the fourth source electrode S4 of the fourth thin film transistor T4.

Hereinafter, an operation mode of the pixel driving circuit illustrated in FIG. 4 will be schematically described. First, when a reset signal is transmitted to the second gate line GLn-1 and the seventh thin film transistor T7 is turned on, the residual current flowing through the anode of the corresponding light emitting structure is discharged through the fourth thin film transistor T4 through the seventh thin film transistor T7, so that light emission caused by the residual current flowing through the anode of the corresponding light emitting structure can be suppressed. Then, when an initialization signal is transmitted to the second gate line GLn-1 and to the initialization line RL, the fourth thin film transistor T4 is turned on, and an initialization voltage Vint is applied to the first gate electrode G1 of the first thin film transistor T1 and the second electrode 140 of the capacitor Cst through the fourth thin film transistor T4, so that the first gate electrode G1 and the capacitor Cst are initialized. Initialization of the first gate electrode G1 can turn on the first thin film transistor T1. It should be noted that the reset signal and the initialization signal above-mentioned can be the same signal.

And then, when a gate signal is transmitted to the first gate line GLn and a data signal is transmitted to the data line DL, both the second thin film transistor T2 and the third thin film transistor T3 are turned on, and the data voltage Vd is applied to the first gate electrode G1 through the second thin film transistor T2, the first thin film transistor T1 and the third thin film transistor T3. At this time, the voltage applied to the first gate electrode G1 is a compensation voltage Vd+Vth, and the compensation voltage applied to the first gate electrode G1 is also applied to the first electrode 120 of the capacitor Cst.

And then, the power supply line VDD applies a driving voltage Vel to the second electrode 140 of the capacitor Cst, and applies the compensation voltage Vd+Vth to the first electrode 120, so that charges corresponding to differences between voltages respectively applied to the two electrodes of the capacitor Cst are stored in the capacitor Cst, and the first thin film transistor T1 is turned on for a predetermined time.

And then, when the emission control signal is applied to the emission control line EM, both the fifth thin film transistor T5 and the sixth thin film transistor T6 are turned on, so that the fifth thin film transistor T5 applies the driving voltage Vel to the first thin film transistor T1. When the driving voltage Vel passes through the first thin film transistor T1 turned on by the capacitor Cst, the difference between the corresponding driving voltage Vel and the voltage applied to the first gate electrode G1 through the capacitor Cst drives the current Id flow through the first drain electrode D1 of the first thin film transistor T1, and drives the current Id be applied to each light emitting structure through the sixth thin film transistor T6, so that each light emitting structure emits light.

FIGS. 5A-5E are schematic diagrams of layers of a pixel driving circuit on an array substrate according to an embodiment of the present disclosure. Hereinafter, the pixel driving circuit on the array substrate will be described with reference to FIGS. 5A-5E.

Figure 5A:
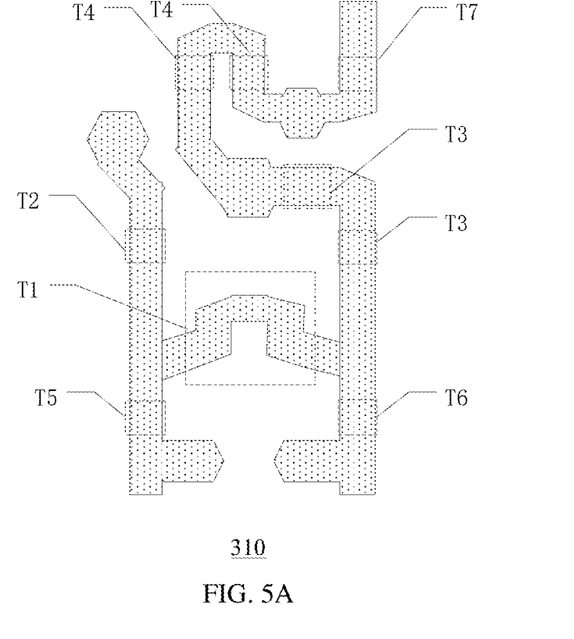
FIGS. 5A-5E are schematic diagrams of layers of a pixel driving circuit on an array substrate according to an embodiment of the present disclosure.

For example, FIG. 5A illustrates a semiconductor layer 310 of the pixel driving circuit. The semiconductor layer 310 can be patterned by using a semiconductor material. The semiconductor layer 310 can be used to fabricate the active layers of the first thin film transistor T1, the second thin film transistor T2, the third thin film transistor T3, the fourth thin film transistor T4, the fifth thin film transistor T5, the sixth thin film transistor T6 and the seventh thin film transistor T7, and each of the active layers can include a source region, a drain region, and a channel region between the source region and the drain region. For example, the semiconductor layer 310 can be made of amorphous silicon, polysilicon, oxide semiconductor materials, and the like. It should be noted that the source region and the drain region can be regions doped with N-type impurities or P-type impurities.

Figure 5B:
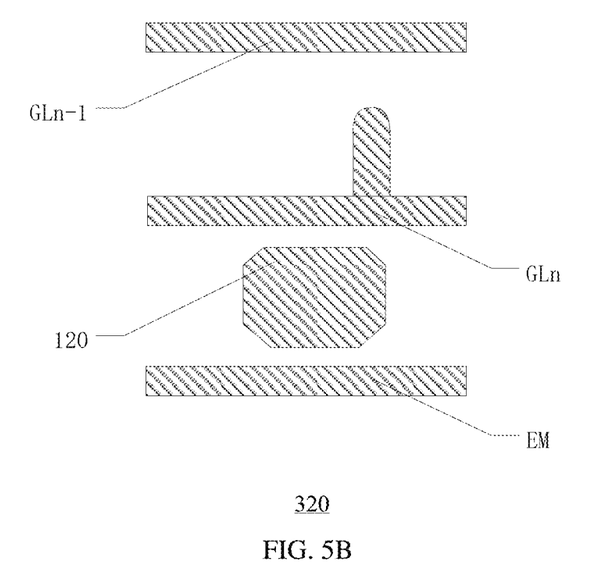

In the array substrate provided by the embodiments of the present disclosure, a gate insulating layer (not illustrated in FIGS. 5A-5E) is formed on the semiconductor layer to protect the semiconductor layer. FIG. 5B illustrates a first conductive layer 320 of the pixel driving circuit, which is arranged on the gate insulating layer so as to be insulated from the semiconductor layer 310. The first conductive layer 320 can include the first electrode 120 of the capacitor Cst, the gate lines GLn, GLn-1, the emission control line EM, and the gate electrodes of the first thin film transistor T1, the second thin film transistor T2, the third thin film transistor T3, the fourth thin film transistor T4, the fifth thin film transistor T5, the sixth thin film transistor T6 and the seventh thin film transistor T7 (e.g., the first gate electrode G1, the second gate electrode G2, the third gate electrode G3, the fourth gate electrode G4, the fifth gate electrode G5, the sixth gate electrode G6 and the seventh gate electrode G7 described above). As illustrated by FIG. 5B, the gate electrodes of the second thin film transistor T2, the fourth thin film transistor T4, the fifth thin film transistor T5, the sixth thin film transistor T6 and the seventh thin film transistor T7 are portions where the gate lines GLn and GLn-1 overlap with the semiconductor layer 310. The third thin film transistor T3 can be a double-gate thin film transistor, one gate electrode of the third thin film transistor T3 can be a portion where the gate line GLn overlaps with the semiconductor layer 310, and the other gate electrode of the third thin film transistor T3 can be a protrusion portion protruding from the gate line GLn. The gate electrode of the first thin film transistor T1 can be the first electrode 120.

Figure 5C:
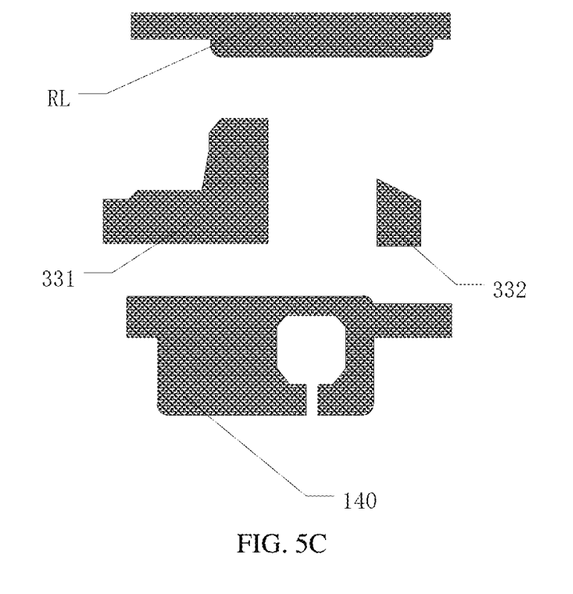

In the array substrate provided by the embodiments of the present disclosure, the above first insulating layer (not illustrated in FIGS. 5A-5E) is formed on the above first conductive layer to protect the above first conductive layer. FIG. 5C illustrates the second conductive layer 330 of the pixel driving circuit, and the second conductive layer 330 includes the second electrode 140 of the capacitor Cst and the initialization line RL.

In some examples, the second conductive layer 330 can further include a first light shielding portion 331 and a second light shielding portion 332. The orthographic projection of the first light shielding portion 331 on the base substrate 110 covers the active layer between the second thin film transistor T2 and the drain electrode of the third thin film transistor T3 and the drain electrode of the fourth thin film transistor T4, thereby preventing external light from affecting the active layers of the second thin film transistor T2, the third thin film transistor T3 and the fourth thin film transistor T4. The orthographic projection of the second light shielding portion 332 on the base substrate 110 covers the active layer between the two gate electrodes of the third thin film transistor T3, thereby preventing external light from affecting the active layer of the second thin film transistor T3. The first light shielding portion 331 can be integrated with the second light shielding portion 332 of the adjacent pixel driving circuit, and is electrically connected to the power supply line VDD through a through-hole penetrating through a second insulating layer 150.

Figure 5D:
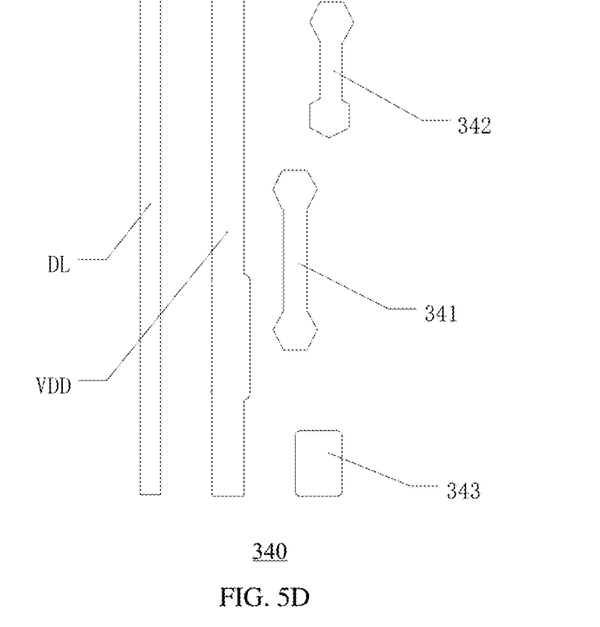
Figure 5E:
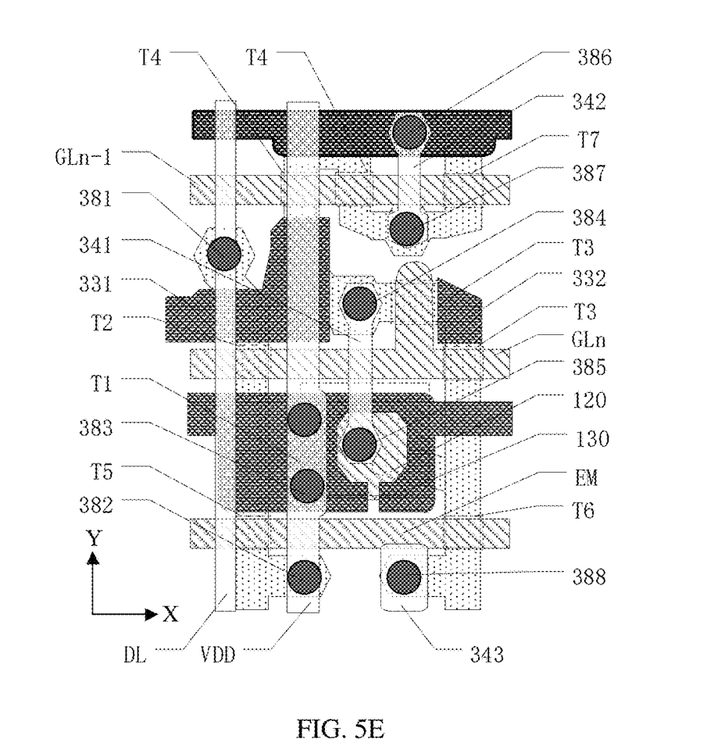

In the array substrate provided by the embodiments of the present disclosure, a second insulating layer (not illustrated in FIGS. 5A-5E) is formed on the second conductive layer to protect the second conductive layer. FIG. 5D illustrates a third conductive layer 340 of the pixel driving circuit, the third conductive layer 340 includes a data line DL and a power supply line VDD. FIG. 5E is a schematic diagram of the stacked positional relationship among the semiconductor layer 310, the first conductive layer 320, the second conductive layer 330 and the third conductive layer 340. As illustrated by FIGS. 5D and 5E, the data line DL is connected to the source region of the second thin film transistor T2 in the semiconductor layer 310 through at least one through-hole (e.g., through-hole 381) in the gate insulating layer, the first insulating layer and the second insulating layer. The power supply line VDD is connected to the source region of the fifth thin film transistor T5 in the semiconductor layer 310 through at least one through-hole (e.g., through-hole 382) in the gate insulating layer, the first insulating layer and the second insulating layer. The power supply line VDD is connected to the second electrode 140 in the second conductive layer 330 through at least one through-hole (e.g., through-hole 383) in the second insulating layer. The third conductive layer 340 further includes a first connection portion 341, a second connection portion 342 and a third connection portion 343. One end of the first connection portion 341 is connected to the drain region corresponding to the third thin film transistor T3 in the semiconductor layer 310 through at least one through-hole (e.g., through-hole 384) in the gate insulating layer, the first insulating layer and the second insulating layer, and the other end of the first connection portion 341 is connected to the gate electrode G1 of the first thin film transistor T1 in the first conductive layer 320 through at least one through-hole (e.g., through-hole 385) in the first insulating layer and the second insulating layer. One end of the second connection portion 342 is connected to the initialization line RL through one through-hole (e.g., through-hole 386) in the second insulating layer, and the other end of the second connection portion 342 is connected to the drain region of the seventh thin film transistor T7 in the semiconductor layer 310 through at least one through-hole (e.g., through-hole 387) in the gate insulating layer, the first insulating layer and the second insulating layer. The third connection portion 343 is connected to the drain region of the sixth thin film transistor T6 in the semiconductor layer 310 through at least one through-hole (e.g., through-hole 388) in the gate insulating layer, the first insulating layer and the second insulating layer.

In some examples, as illustrated by FIG. 5E, the first electrode 120 of the capacitor Cst and the first gate electrode G1 of the first thin film transistor T1 can be the same structure, at this time, the orthographic projection of the first through-hole 141 on the base substrate 110 at least partially overlaps with the orthographic projection of the first gate electrode G1 of the first thin film transistor T1 on the base substrate 110.

In some examples, as illustrated by FIG. 5E, the array substrate includes the above third conductive layer 340, the gate line GL and the data line DL. The third conductive layer 340 is located on the side of the second insulating layer 150 away from the second electrode 140. The gate line GL is located in the first conductive layer 320 and extends in the first direction X. The data line DL is located in the third conductive layer 340 and extends in the second direction Y, and the extending direction of the slit 142 is approximately parallel to the second direction. It should be noted that the above-mentioned approximately parallel includes the case where the extending direction of the slit is completely parallel to the second direction, and also includes the case where the angle between the extending direction of the slit and the second direction is less than 5 degrees.

Figure 6:
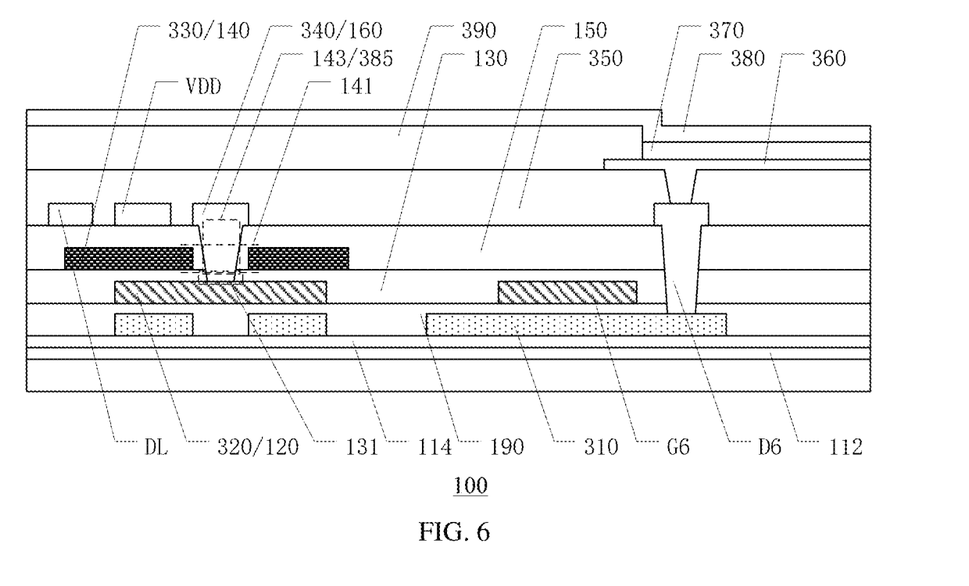
FIG. 6 is a schematic sectional view of an array substrate in the B-B direction in FIG. 3 according to an embodiment of the present disclosure.

FIG. 6 is a schematic sectional view of an array substrate according to an embodiment of the present disclosure along the B-B direction in FIG. 3. FIG. 6 illustrates the second insulating layer 150. As illustrated by FIG. 6, the second insulating layer 150 is located on the side of the second electrode 140 away from the base substrate 110, that is, on the above second conductive layer. The array substrate also includes a second through-hole 131 and a connection electrode 160. The second through-hole 131 is located in first insulating layer 130 and exposes the first electrode 120. The second insulating layer 150 is partially located in the first through-hole 141 and forms a third through-hole 143 insulated from the second electrode 140 in the first through-hole 141. The orthographic projection of the third through-hole 143 on the base substrate 110 at least partially overlaps with the orthographic projection of the second through-hole 131 on the base substrate 110, and the connection electrode 160 is located in the second through-hole 131 and the third through-hole 143 and is connected to the first electrode 120. For example, the above connection electrode 160 can be the above first connection portion 341, and the above third through-hole 343 can be the above 385.

In some examples, as illustrated by FIG. 6, the array substrate includes the active layer 310, the gate insulating layer 190, the first conductive layer 320 and the second conductive layer 330 described above. The active layer 310 is located on the base substrate 110, the gate insulating layer 190 is located on the side of the active layer 310 away from the base substrate 110, and the first conductive layer 320 is located on the side of the gate insulating layer 190 away from the active layer 310. The first electrode 120 is located in the first conductive layer 320, the first insulating layer 130 is located on the side of the first insulating layer 320 away from the gate insulating layer 190, the second conductive layer 330 is located on the side of the first insulating layer 130 away from the first conductive layer 320, and the second electrode 140 is located in the second conductive layer 330.

In some examples, as illustrated by FIG. 6, the array substrate further includes a planarization layer 350, an anode 360, an organic light emitting layer 370, and a cathode 380. The planarization layer 350 is located on the side of the third conductive layer 340 away from the second insulating layer 150. The anode 360 is located on the side of the planarization layer 350 away from the third conductive layer 340. The organic light emitting layer 370 is located on the side of the anode 360 away from the planarization layer 350. The cathode 360 is located on the side of the organic light emitting layer 370 away from the anode 360. The array substrate can be an array substrate of an OLED display substrate, that is, the light emitting structure on the array substrate is OLED.

In some examples, as illustrated by FIG. 6, when the base substrate 110 is a glass substrate, the array substrate further includes a polyimide layer 112 and a buffer layer 114, the polyimide layer 112 is on the base substrate 110, and the buffer layer 114 is on the side of the polyimide layer 112 away from the base substrate 110. The polyimide layer 112 and the buffer layer 114 can prevent defects on the base substrate 110 from affecting the performance of the array substrate.

An embodiment of the present disclosure further provides a display device, which includes the above array substrate. Therefore, the display device can also ensure that, when misalignment occurs between the base substrate and the mask plate or the exposure device, and causes overlapping deviation between the formed first electrode and the second electrode, the actual capacitance value of the capacitor is consistent with the design value, and further improving the yield of the display device. In addition, the display device can flexibly adjust the capacitance value of the capacitor by adjusting the size of the slit without changing the shape and size of the first electrode and the second electrode.

For example, in some examples, the display device can be any product or component with display function, such as a smart phone, a tablet computer, a television, a display, a notebook computer, a digital photo frame, a navigator, etc.

The following statements should be noted:
(1) The accompanying drawings involve only the structure(s) in connection with the embodiment(s) of the present disclosure, and other structure(s) can be referred to common design(s).
(2) In case of no conflict, features in one embodiment or in different embodiments can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

The invention claimed is:

1. An array substrate, comprising:
   a base substrate;
   a first electrode on the base substrate;
   a first insulating layer on a side of the first electrode away from the base substrate; and
   a second electrode on a side of the first insulating layer away from the first electrode,
   wherein the second electrode is provided with a first through-hole, and a slit communicated with the first through-hole and extending from the first through-hole to an edge of the second electrode, and an orthographic projection of the first electrode on the base substrate completely falls within an orthographic projection of the second electrode, the first through-hole and the slit on the base substrate.

2. The array substrate according to claim 1, further comprising:
   a second insulating layer on a side of the second electrode away from the base substrate; and
   a connection electrode,
   wherein the first insulating layer is provided with a second through-hole exposing the first electrode, the second insulating layer is partially located in the first through-hole and forms a third through-hole separated from the second electrode in the first through-hole, an orthographic projection of the third through-hole on the base substrate at least partially overlaps with an orthographic projection of the second through-hole on the base substrate, and the connection electrode is located in the second through-hole and in the third through-hole, and connected to the first electrode.

3. The array substrate according to claim 2, further comprising:
   an active layer on the base substrate;
   a gate insulating layer on a side of the active layer away from the base substrate;
   a first conductive layer on a side of the gate insulating layer away from the active layer; and
   a second conductive layer,
   wherein the first conductive layer comprises the first electrode, the first insulating layer is on a side of the first conductive layer away from the gate insulating layer, the second conductive layer is on a side of the first insulating layer away from the first conductive layer, and the second conductive layer comprises the second electrode.

4. The array substrate according to claim 1, wherein the slit has an extending direction, and a length of the slit in the extending direction is in a range from 1 µm to 30 µm.

5. The array substrate according to claim 1, wherein the slit has an extending direction, and a width of the slit in a direction perpendicular to the extending direction is in a range from 0.01 µm to 20 µm.

6. The array substrate according to claim 1, further comprising:
   an active layer on the base substrate;
   a gate insulating layer on a side of the active layer away from the base substrate;
   a first conductive layer on a side of the gate insulating layer away from the active layer; and
   a second conductive layer,
   wherein the first conductive layer comprises the first electrode, the first insulating layer is on a side of the first conductive layer away from the gate insulating layer, the second conductive layer is on a side of the first insulating layer away from the first conductive layer, and the second conductive layer comprises the second electrode.

7. The array substrate according to claim 6, further comprising:
a third conductive layer on a side of the second insulating layer away from the second electrode;
a gate line in the first conductive layer and extending in a first direction; and
a data line in the third conductive layer and extending in a second direction,
wherein an extending direction of the slit is substantially parallel to the second direction.

8. The array substrate according to claim 7, further comprising:
a planarization layer on a side of the third conductive layer away from the second insulating layer;
an anode on a side of the planarization layer away from the third conductive layer;
an organic light emitting layer on a side of the anode away from the planarization layer; and
a cathode on a side of the organic light emitting layer away from the anode.

9. The array substrate according to claim 1, further comprising:
a first thin film transistor, comprising a first gate electrode, a first source electrode and a first drain electrode;
a second thin film transistor, comprising a second gate electrode, a second source electrode and a second drain electrode;
a third thin film transistor, comprising a third gate electrode, a third source electrode and a third drain electrode;
a fourth thin film transistor, comprising a fourth gate electrode, a fourth source electrode and a fourth drain electrode;
a fifth thin film transistor, comprising a fifth gate electrode, a fifth source electrode and a fifth drain electrode;
a sixth thin film transistor, comprising a sixth gate electrode, a sixth source electrode and a sixth drain electrode; and
a seventh thin film transistor, comprising a seventh gate electrode, a seventh source electrode and a seventh drain electrode,
wherein the first gate electrode of the first thin film transistor is connected to the third drain electrode of the third thin film transistor and the fourth drain electrode of the fourth thin film transistor, the first source electrode of the first thin film transistor is connected to the second drain electrode of the second thin film transistor and the fifth drain electrode of the fifth thin film transistor, and the first drain electrode of the first thin film transistor is connected to the third source electrode of the third thin film transistor and the sixth source electrode of the sixth thin film transistor,
the first electrode is connected to the first gate electrode of the first thin film transistor and the third drain electrode of the third thin film transistor, and the second electrode is configured to be connected to a power supply line.

10. The array substrate according to claim 9, wherein an orthographic projection of the first through-hole on the base substrate at least partially overlaps with an orthographic projection of the first gate electrode of the first thin film transistor on the base substrate.

11. The array substrate according to claim 9, wherein the first electrode and the first gate electrode of the first thin film transistor are the same structure.

12. The array substrate according to claim 1, wherein the first electrode comprises a rectangle shape.

13. The array substrate according to claim 12, wherein the first electrode comprises a rectangle shape with chamfers at corners.

14. A display device, comprising the array substrate according to claim 1.

15. The array substrate according to claim 1, wherein the first electrode, the second electrode, and the first insulating layer between the first electrode and the second electrode constitute a capacitor.

* * * * *

UNITED STATES PATENT AND TRADEMARK OFFICE
CERTIFICATE OF CORRECTION

PATENT NO. : 11,605,689 B2
APPLICATION NO. : 16/975241
DATED : March 14, 2023
INVENTOR(S) : Yuan et al.

It is certified that error appears in the above-identified patent and that said Letters Patent is hereby corrected as shown below:

On the Title Page

Column 1, Item (73) (Assignees), please change: "BOETECHNOLOGY GROUP CO., LTD., Beijing, (CN)" to correctly read:
-- BOE TECHNOLOGY GROUP CO., LTD., Beijing, (CN) --

Signed and Sealed this
Thirteenth Day of June, 2023

Katherine Kelly Vidal
*Director of the United States Patent and Trademark Office*